(12) United States Patent
Higo

(10) Patent No.: US 6,768,152 B2
(45) Date of Patent: Jul. 27, 2004

(54) MAGNETORESISTIVE EFFECT ELEMENT AND MAGNETIC MEMORY DEVICE

(75) Inventor: Yutaka Higo, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/360,166

(22) Filed: Feb. 6, 2003

(65) Prior Publication Data

US 2003/0169147 A1 Sep. 11, 2003

(30) Foreign Application Priority Data

Feb. 15, 2002 (JP) .......................................... 2002-037660

(51) Int. Cl.[7] .......................................... H01L 31/119
(52) U.S. Cl. ......................... 257/295; 257/295; 257/294
(58) Field of Search ............................... 257/295, 294, 257/30, 421, 427, 424; 365/170

(56) References Cited

U.S. PATENT DOCUMENTS 6,201,259 B1 * 3/2001 Sato et al. .................... 257/30

* cited by examiner

Primary Examiner—David Nelms
Assistant Examiner—Thinh T Nguyen
(74) Attorney, Agent, or Firm—Robert J. Depke; Holland & Knight LLP

(57) ABSTRACT

In a magnetoresistive effect element in which at least a free layer (12) made of a ferromagnetic material, a nonmagnetic layer (13) made of a nonmagnetic material and a fixed layer (11) made of a ferromagnetic material and of which the magnetization direction is fixed are laminated in that order and in which information can be recorded by the use of a change of magnetization direction in the free layer (12), the free layer (12) is divided into a plurality of regions (12a), (12b), these regions (12a), (12b) are located around a write electrode (8) extending along the direction in which these respective layers (11) to (13) are laminated so as to surround the write electrode (8) and the respective regions (12a), (12b) surrounding the write electrode (8) constitute a magnetic field returning structure for returning a magnetic field.

10 Claims, 7 Drawing Sheets

Plan View | Cross-Sectional View Taken Along The Line A-A' | Cross-Sectional View Taken Along The Line B-B'

MAGNETORESISTIVE EFFECT ELEMENT AND MAGNETIC MEMORY DEVICE

BACKGROUND OF THE INVENTION

1. Field of the Invention

The present invention relates to a magnetoresistive effect element for generating so-called MR (magnetoresistive) effect in which a resistance value changes with application of a magnetic field from the outside and a magnetic memory device fabricated as a memory device capable of storing information by the use of a magnetoresistive effect element.

2. Description of the Related Art

In recent years, as information communication devices, in particular, personal small information communication devices such as portable terminal devices (e.g. personal digital assistants) are widely spreading, it is requested that devices such as memories and logic devices comprising these information communication devices or portable terminal devices should become higher in performance, such as they should become higher in integration degree, they can operate at higher speed and they can consume lesser electric power. Particularly, technologies that can make nonvolatile memories become higher in density and larger in storage capacity are becoming more and more important as complementary technologies for replacing hard disk devices and optical disk devices with nonvolatile memories because it is essentially difficult to miniaturize hard disk devices and optical disk devices because they cannot remove their movable portions (e.g. head seek mechanism and disk rotation mechanism).

Flash memories using semiconductors and an FeRAM (ferro electric random-access memory) using a ferro dielectric material are widely known as nonvolatile memories. However, flash memories are slow in information write speed as compared with a DRAM (dynamic random-access memory) and a SRAM (static random-access memory). Further, it has been pointed out that the FeRAM cannot be rewritten so many times. Accordingly, a magnetic memory device called an MRAM (magnetic random-access memory) utilizing a magnetoresistive effect has been proposed and receives a remarkable attention as a nonvolatile memory that can overcome these defects (e.g. "Naji et. al ISSCC2001").

The MRAM is able to record information by the use of a giant magnetoresistive effect (giant magnetoresistive: GMR) type storage element or a tunnel magnetoresistive effect (tunnel magnetoresistive: TMR) type storage element (these elements will be generally referred to as a "magnetoresistive effect element"). The magnetoresistive effect element includes a multilayer film structure including two ferromagnetic material layers and a nonmagnetic material layer made of an insulating material layer or a conductor sandwiched between the two ferromagnetic material layers. One ferromagnetic material layer is used as a free layer (free layer) whose magnetization direction can be inverted and the other ferromagnetic material layer is used as a fixed layer (pinned layer) whose magnetization direction is fixed (pinned) This magnetoresistive effect element is able to record information by utilizing the fact that a resistance value is changed in response to the magnetization direction of the free layer to discriminate "0" and "1" of information.

In the MRAM, these magnetoresistive effect elements are arrayed in an XY matrix fashion. The MRAM includes word lines and bit lines crossing these element groups in the horizontal and vertical directions. Then, the magnetization direction of the free layer in the magnetoresistive effect element located at the crossing area is controlled by using a synthetic current magnetic field generated when a current flows through both of the word lines and the bits lines, whereby information can be written in the magnetoresistive effect element. At that time, the magnetization direction of the free layer in each magnetoresistive effect element is not changed by magnetic fields solely generated from the word lines or the bit lines but the above magnetization direction is changed by a synthesized magnetic field of both of the word lines and the bit lines. Accordingly, even when the magnetoresistive effect elements are arrayed in a matrix fashion in the MRAM, information can be selectively written in a desired magnetoresistive effect element.

On the other hand, when information is read out from each magnetoresistive effect element, the magnetoresistive effect element is selected by using a device such as a transistor and the magnetization direction of the free layer in the magnetoresistive effect element is obtained as a voltage signal through MR effect to thereby read out information from the magnetoresistive effect element. This point will be described below more in detail. In general, electron spins are polarized in the ferromagnetic material layer such as the free layer or the fixed layer and up-spins and down-spins become either majority spins having large state density or minority spins having small state density. When the magnetization directions of the free layer and the fixed layer are parallel to each other, if the up-spins in the free layer are majority spins, then up-spins are majority spins in the fixed layer. When on the other hand the magnetization directions of the free layer and the fixed layer are anti-parallel to each other, if the up-spins are majority spins in the free layer, then up-spins in the fixed layer become minority spins. When electrons pass the nonmagnetic material layer between the free layer and the fixed layer, spins are preserved and a probability at which a certain spin will pass the nonmagnetic material layer is proportional to a product of state densities of spins of the two ferromagnetic material layers which sandwich the nonmagnetic material layer. Therefore, when the magnetization directions of the free layer and the fixed layer are parallel to each other, majority spins having large state densities become able to pass the nonmagnetic material layer. When the magnetization directions of the free layer and the fixed layer are anti-parallel to each other, majority spins having large state density become unable to pass the nonmagnetic material layer. For this reason, when the magnetization directions of the free layer and the fixed layer are anti-parallel to each other, a resistance increases as compared with the case in which the magnetization directions of the free layer and the fixed layer are parallel to each other. Therefore, if a voltage between the free layer and the fixed layer is detected through the word lines and the bit lines, then it becomes possible to read out information from the free layer.

As described above, since the MRAM using the magnetoresistive effect element utilizes the magnetization direction of the free layer in the magnetoresistive effect element to judge information, the MRAM is able to record information in a nonvolatile fashion with excellent response characteristics. Further, since the structure of the storage element (memory cell) that can hold information is simple, the magnetoresistive effect element becomes suitable for microminiaturization and increasing integration degree.

However, in the magnetoresistive effect element for use with the above-mentioned related-art MRAM, since the structure of the magnetoresistive effect element is simple, the magnetoresistive effect element is suitable for microminiaturization and increasing the integration degree.

However, if the magnetoresistive effect element is microminiaturized much more and is increased in integration degree much more, then disorder of magnetization occurs at the end portion of the magnetoresistive effect element, which causes the following problems to arise.

These problems will be described in detail. Specifically, since the magnetoresistive effect elements are arrayed in the MRAM in a matrix fashion, if the magnetoresistive effect element is microminiaturized much more and is increased in integration degree much more, then each magnetoresistive effect element is influenced by a leakage magnetic field from the adjacent magnetoresistive effect element. There is a risk that coercive force in the free layer of each magnetoresistive effect element will change. The change of such coercive force makes it difficult to select elements when information is written in the MRAM. In particular, the change of the coercive force becomes serious as the element size is reduced in accordance with the microminiaturization and the increase of the integration degree of the magnetoresistive effect element.

In general, within the free layer of the magnetoresistive effect element, a microscopic magnetic moment is not uniform and can take various states such as eddy state, C-like state and S-like state so as to minimize magnetostatic energy. Coercive forces in these respective states are not always the same even when the free layers are made of the same ferromagnetic material. Although the state that the microscopic magnetic moment can take depends upon the shape and size of the magnetoresistive effect element, the shapes used as related-art magnetoresistive effect elements are strip-like shape or elliptic in most cases, there is a possibility that the microscopic magnetic moment will take a plurality of states near, in particular, the end portion of the element. A plurality of such states is not preferable because it causes a coercive force in the free layer of each magnetoresistive effect element to be dispersed.

SUMMARY OF THE INVENTION

In view of the aforesaid aspect, it is an object of the present invention to provide a magnetoresistive effect element and a magnetic memory device in which changes and dispersions of a coercive force can be suppressed as much as possible and in which satisfactory information recording characteristics can be realized even when a magnetoresistive effect element and a magnetic memory device are further microminiaturized and are increased in integration degree.

According to an aspect of the present invention, there is provided a magnetoresistive effect element in which at least a free layer made of a ferromagnetic material, a nonmagnetic layer made of a nonmagnetic material and a fixed layer made of a ferromagnetic material and of which the magnetization direction is fixed are laminated in that order and in which information is recorded by the use of a change of the magnetization direction of the free layer. This magnetoresistive effect element includes a magnetic field returning structure for returning a magnetic field generated by the free layer.

According to other aspect of the present invention, there is provided a magnetoresistive effect element in which at least a free layer made of a ferromagnetic material, a nonmagnetic layer made of a nonmagnetic material and a fixed layer made of a ferromagnetic material and of which the magnetization direction is fixed are laminated in that order and in which information is recorded by the use of a change of a magnetization direction of the free layer, the magnetoresistive effect element is characterized in that the free layer is divided into a plurality of regions, a plurality of regions are located around a write electrode extending in the lamination direction of each layer so as to surround the write electrode and the respective regions surrounding the write electrode constitute a magnetic field returning structure.

According to a further aspect of the present invention, there is provided a magnetic memory device including a magnetoresistive effect element in which at least a free layer made of a ferromagnetic material, a nonmagnetic layer made of a nonmagnetic material and a fixed layer made of a ferromagnetic material and of which the magnetization direction is fixed are laminated in that order and in which information is recorded by the use of a change of the magnetization direction of the free layer. The magnetic memory device includes a magnetic field returning structure for returning a magnetic field generated by the free layer.

In accordance with yet a further aspect of the present invention, there is provided a magnetic memory device including a magnetoresistive effect element in which at least a free layer made of a ferromagnetic material, a nonmagnetic layer made of a nonmagnetic material and a fixed layer made of a ferromagnetic material and of which the magnetization direction is fixed are laminated in that order and in which information is recorded by the use of a change of a magnetization direction of the free layer. This magnetic memory device is characterized in that the free layer is divided into a plurality of regions, a plurality of regions are located around a write electrode extending in the lamination direction of respective layers so as to surround the write electrode and the respective regions surrounding the write electrode constitute a magnetic field returning structure.

According to the magnetoresistive effect element and the magnetic memory device having the above-mentioned arrangement, since the magnetoresistive effect element and the magnetic memory device have the magnetic field returning structure, a magnetic field, generated by the free layer of the magnetoresistive effect element, is returned so that a magnetic field can be prevented from being leaked to the outside of the magnetoresistive effect element as much as possible. Accordingly, even when the magnetoresistive effect element is further microminiaturized and is increased in integration degree, the adjacent magnetoresistive effect element can be prevented from being influenced by a leakage magnetic field. Further, since a magnetic field is returned, a magnetic moment can take a uniform state within the free layer of the magnetoresistive effect element, whereby magnetic coercive force can be stabilized.

BRIEF DESCRIPTION OF THE DRAWINGS

FIGS. 4A to 4C show a first example of an arrangement of a TMR element according to the present invention wherein FIG. 4A is a perspective view, FIG. 4B is a cross-sectional side view and FIG. 4C is a plan view;

FIGS. 7A and 7B schematically show a second example of an arrangement of a TMR element according to the present invention wherein FIG. 7A is a perspective view and FIG. 7B is a cross-sectional side view;

FIGS. 8A and 8B schematically show a third example of an arrangement of a TMR element according to the present invention wherein FIGS. 8A and 8B are both plan views.

DESCRIPTION OF THE PREFERRED EMBODIMENTS

A magnetoresistive effect element and a magnetic memory device according to the present invention will be described below with reference to the drawings. Byway of example, let us explain a TMR type spin-valve element (hereinafter simply referred to as a "TMR element") serving as a magnetoresistive effect element and an MRAM, which includes a TMR element, serving as a magnetic memory device.

First, a schematic arrangement of the whole of a magnetic memory device according to the present invention will be described.

Figure 1:
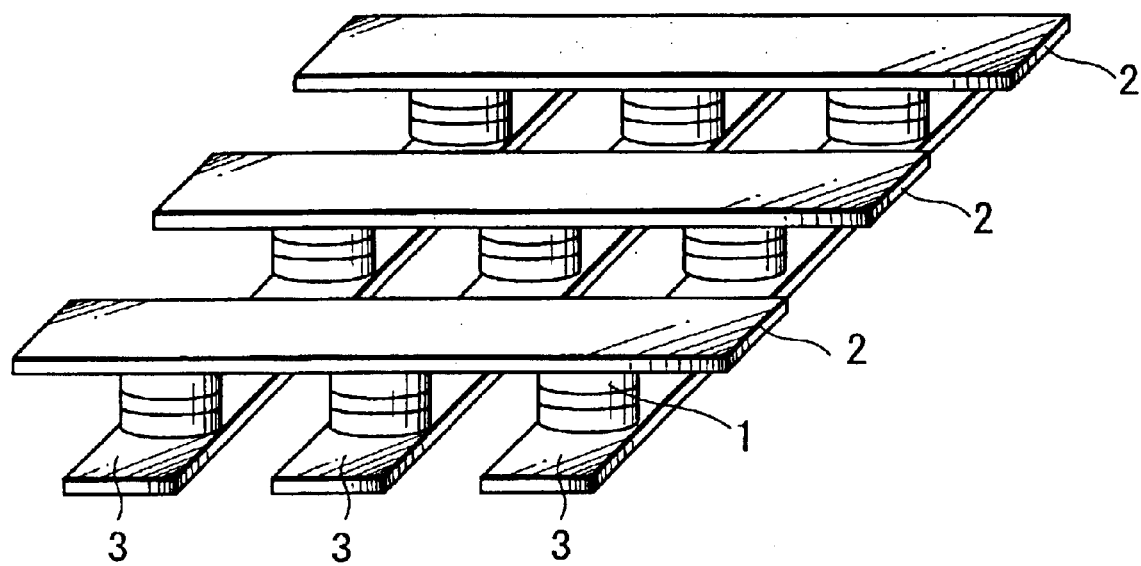
FIG. 1 is a schematic perspective view showing an example of a fundamental arrangement of an MRAM.

FIG. 1 of the accompanying drawings is a schematic perspective view showing an example of a fundamental arrangement of an MRAM (magnetic random-access memory). As shown in FIG. 1, the MRAM includes a plurality of TMR elements 1 that are disposed in an XY matrix fashion (i.e. in a two-dimensional fashion) Write lines 2 and lower conductors 3 that are intersecting with each other are provided so as to cross groups of the TMR elements 1 in response to rows and columns in which these TMR elements 1 are located. The TMR elements 1 are disposed such that they are located at these crossing areas under the condition that they may be sandwiched by the write lines 2 and the lower conductors 3 in the upper and lower direction. The write lines 2 and the lower conductors 3 are formed by a well-known method in which write lines and lower conductors are obtained by selectively etching conductive substances of Al (aluminum), Cu (copper) or alloy thereof after the conductive substances had been deposited chemically or physically.

Figure 2:
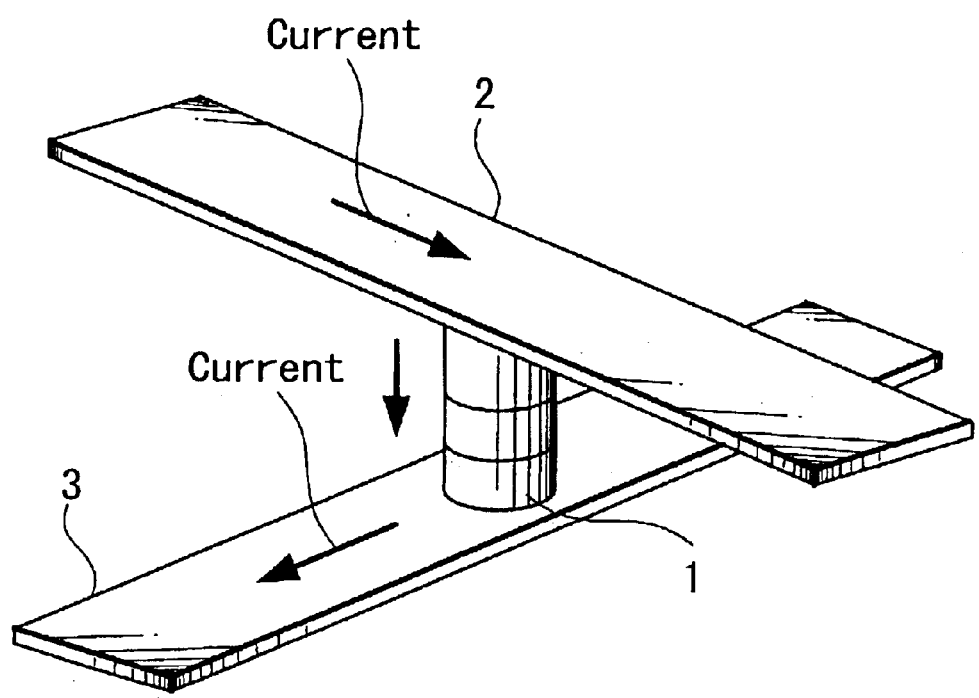
FIG. 2 is a schematic perspective view showing an example of an arrangement of a single TMR element portion comprising the MRAM.

FIG. 2 is a schematic perspective view showing an example of an arrangement of a single TMR element portion comprising the MRAM. In the portion of each TMR element 1, a write electrode (not shown) is provided so as to extend through substantially the central portion of the TMR element 1 as will be described later on. Either a downward current or upward current flows through the write electrode when a current is selectively applied to the write line 2 and the lower conductor 3 as shown in FIG. 2. This current is adapted to generate either a clockwise or counter-clockwise current magnetic field around the write electrode. With the above-mentioned arrangement, in the MRAM, a current selectively flows through the write electrode which extends through any one of the TMR elements located in an XY matrix fashion to generate a current magnetic field and the current magnetic field thus generated is used to change the magnetization direction of the free layer in the TMR element 1, thereby resulting in information being written on the TMR element 1.

Figure 3:
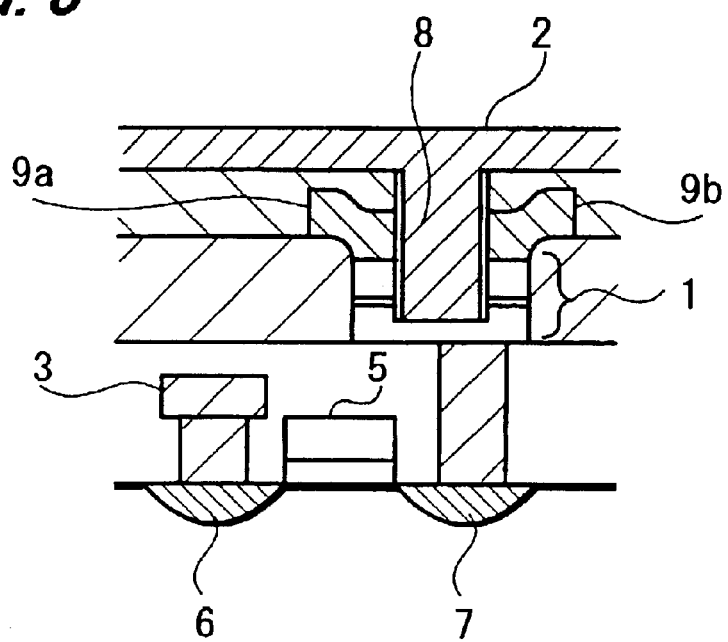
FIG. 3 is a schematic diagram showing an example of an arrangement of the single TMR element portion comprising the MRAM in a cross-sectional fashion.

FIG. 3 is a schematic diagram showing an example of an arrangement of a single TMR element portion comprising the MRAM in a cross-sectional fashion. In the portion of each TMR element 1, a field-effect transistor (FET) composed of a gate electrode 5, a source region 6 and a drain region 7 is disposed on a semiconductor substrate 4. Further, over the field-effect transistor, there are disposed the TMR element 1, the write line 2, the lower conductor 3 and the write electrode 8. Above the TMR element 1, there are disposed two read lines across the write electrode 8. With this arrangement, in the MRAM, the TMR element 1 is selected by the field-effect transistor and the magnetization direction of the free layer in the TMR element 1 is obtained as a voltage signal, whereby information is read out from the TMR element 1. The manner in which information is read out from the TMR element 1 by the use of the two read lines will be described in detail later on.

Figure 4A:
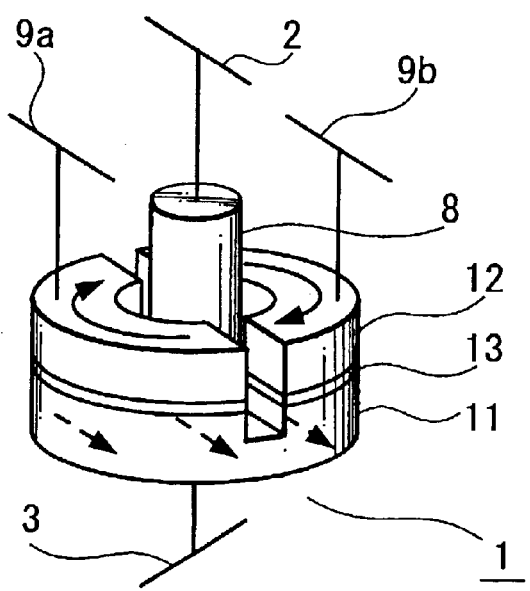
Figure 4B:
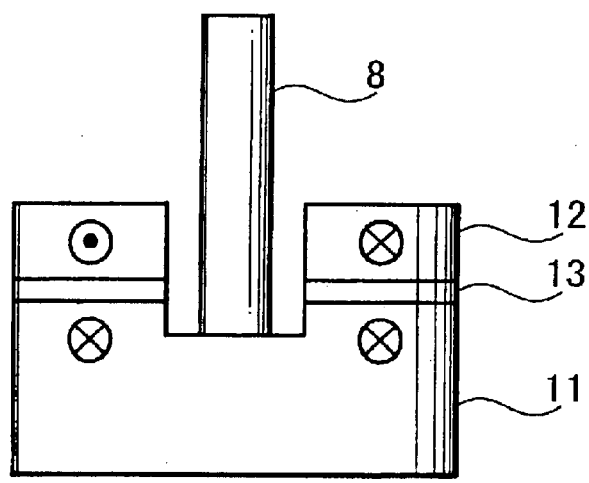
Figure 4C:
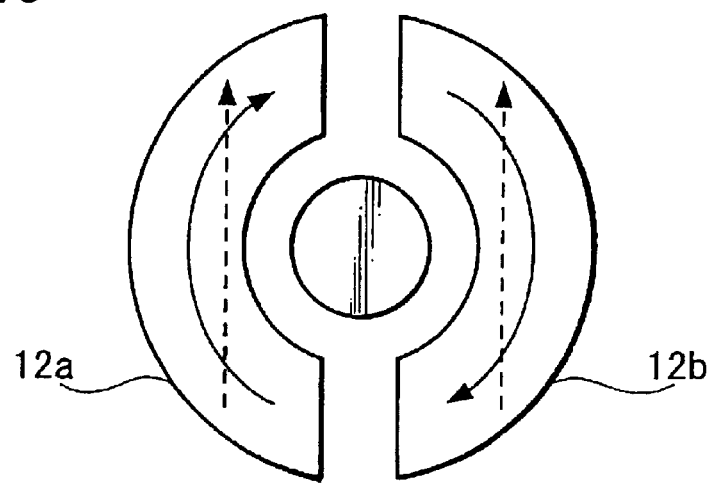

Subsequently, the arrangement of the TMR element 1 itself for use in such MRAM will be described. FIGS. 4A to 4C are schematic diagrams showing a first example of the arrangement of the TMR element 1. As shown in FIGS. 4A and 4B, the TMR element 1 has a film arrangement which is what might be called a ferromagnetic tunnel junction (Magnetic Tunnel Junction: MTJ) The MTJ structure has a trilayer structure composed of ferromagnetic material/nonmagnetic material/ferromagnetic material. One ferromagnetic material layer is used as a fixed layer (pinned layer) whose magnetization direction is fixed (pinned), the other ferromagnetic material layer is used as a free layer (free layer) 12, and the nonmagnetic material layer sandwiched between the two ferromagnetic layers 11 and 12 is used as a tunnel barrier layer 13. Then, information is written (recorded) in the TMR element 1 by changing the magnetization direction of the free layer 12 with application of a current magnetic field generated by the write electrode 8. Further, the magnetization direction in the free layer 12 and the voltage signal are made corresponding to each other through the tunnel MR effect.

The fixed layer 11 and the free layer 12 mat be made of a ferromagnetic material of alloy of one kind of alloy of more than two kinds of Fe (iron), Ni (nickel), Co (cobalt) or alloy of these materials containing different kind of added elements and may have a film thickness of approximately 20 nm. Further, the tunnel barrier layer 13 may be made of a nonmagnetic conductive material such as oxide of Al (aluminum), for example, and may have a film thickness of approximately 1 nm.

At substantially the central portion of the TMR element 1 composed of these respective layers 11, 12, 13, there is provided a write electrode 8 extending along the direction in which these respective layers 11, 12, 13 are laminated so as to extend through substantially the central portion. Accordingly, the respective layers 11, 12, 13 comprising the TMR element 1 are formed as shapes that may surround the write electrode 8. As the shape that may surround the write electrode 8, there may be enumerated an annular shape having an outer diameter of 120 nm. The write electrode 8 may be made of a conductive nonmagnetic material such as Cu (copper), Ag (silver), Pt (platinum) and W (tungsten).

A part of the fixed layer 11, the free layer 12 and the tunnel barrier layer 13 surrounding the write electrode 8 are cut at two portions on the annular circumference. However, so long as at least the free layer 12 is cut, the fixed layer 11 and the tunnel barrier layer 13 need not be cut. On the contrary, the fixed layer 11 need not be cut partly and may be cut wholly.

Through the above-mentioned cutting, at least the free layer 12 is divided into a first region 12$a$ and a second region 12b as shown in FIG. 4C. The first and second regions 12a and 12b are formed like approximately C-shapes (containing C-like symmetric shapes) from a plane standpoint and are opposed to each other so as to surround the write electrode 8. Then, the first and second regions 12a and 12b constitute independent two MTJ structures between them and the fixed layer 11 through the tunnel barrier layer 13.

Since the first and second regions 12a and 12b constitute the independent two MTJ structures as described above, the free layer 12 and so on are cut along the magnetization fixed direction in the fixed layer 11 as shown in FIG. 4A. Further, read lines are independently interconnected to the first and second regions 12a, 12b to obtain the respective magnetization directions as voltage signals. To this end, there are disposed the two read lines across the write electrode 8 as described above.

One end of the write electrode 8 surrounded by the first and second regions 12a, 12b is interconnected to the write line 2. The other end of the write electrode 8 is interconnected to the fixed layer 11 which is cut partly and is interconnected to the lower conductor 3 through the fixed layer 11.

Next, the manufacturing process of the TMR element 1 having the above-mentioned arrangement will be described. FIGS. 5A and 5B and FIGS. 6A to 6D are explanatory diagrams showing examples of a manufacturing process of the TMR element. The TMR element 1 is formed above the field-effect transistor disposed on the semiconductor substrate 4 (see FIG. 4). The field-effect transistor and the like may be manufactured by the process similar to that of the related art and need not be described herein.

Figure 5A:
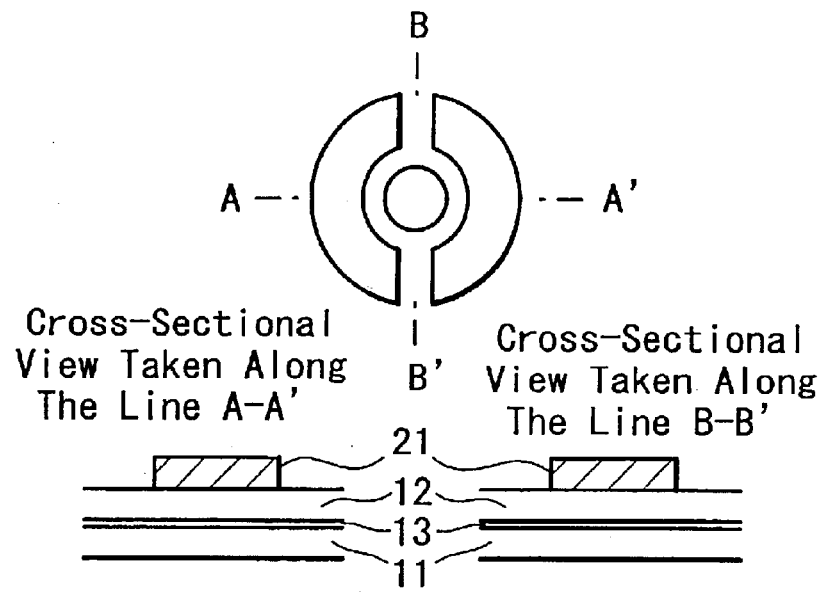
FIGS. 5A and 5B are explanatory diagrams showing an example of a TMR element manufacturing process to which the present invention is applied and illustrating examples of arrangements in the above-mentioned manufacturing process.
Figure 5A:
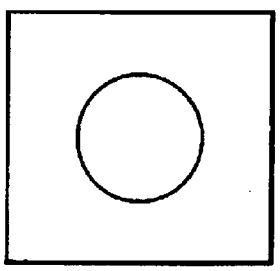

When the TMR element 1 is manufactured, first, as shown in FIG. 5A, MTJ structures composed of the fixed layer 11, the tunnel barrier layer 13 and the free layer. 12 are deposited in that order by sputtering, for example, (see the upper stage in FIG. 5A). Thereafter, a lamination film having an MTJ structure in which a plane shape is approximately disk (disk-like shape) is obtained by photolithography (see the lower stage in FIG. 5A).

Figure 5B:
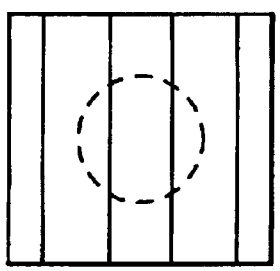
Figure 5B:
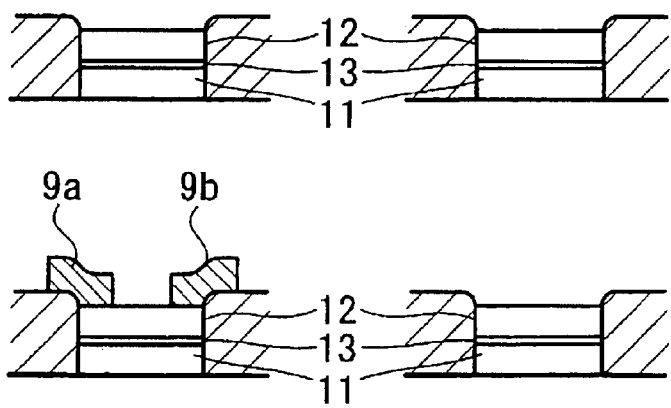

Then, after the lamination film of approximately disk-like shape had been obtained, the elements are insulated and the read lines are formed. Specifically, as shown in FIG. 5B, after insulating materials such as $Al_2O_3$ (oxide aluminum) and $SiO_2$ (silicon dioxide) had been deposited and thereby the MTJ lamination film had been buried, the upper surface of the MTJ lamination film is exposed by releasing a resist film 21 that is used to obtain the approximately disk-like flat shape. Further, the two read lines which are interconnected to the end portion of the MTJ lamination film are formed so as to extend in a predetermined direction (e.g. upper and lower direction in the flat surface in FIG. 5B). The read lines 9a, 9b may be formed by sputtering a conductive material such as Cu (copper).

Figure 6A:
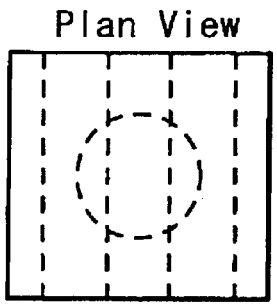
FIGS. 6A to 6D are explanatory diagrams showing an example of a TMR element manufacturing process to which the present invention is applied and illustrating examples of arrangements in the above-mentioned manufacturing process.
Figure 6A:
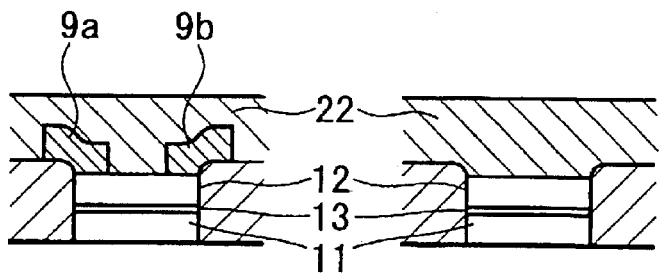

After the read lines 9a, 9b had been formed, as shown in FIG. 6A, an interlayer insulating film 22 is deposited by a suitable material such as $Al_2O_3$ and $SiO_2$ and its surface is made flat by the use of a polishing system, such as a CMP (Chemical Mechanical Polishing).

Figure 6B:
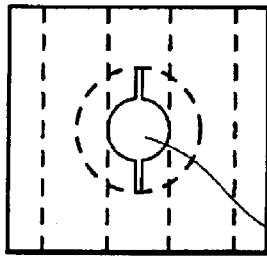
Figure 6B:
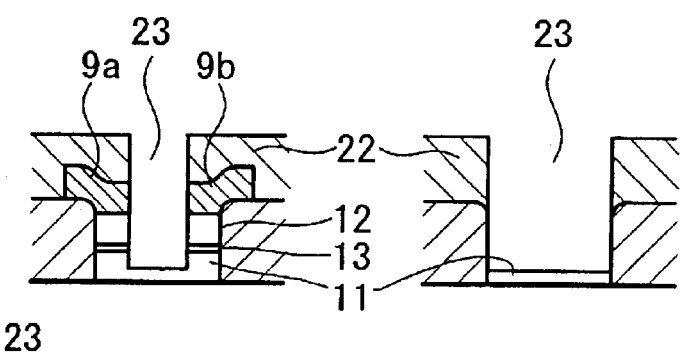

After the surface of the interlayer insulating film 22 had been made flat, write electrode holes are opened and the MTJ lamination film is cut. Specifically, as shown in FIG. 6B, an opening 23 is formed through the interlayer insulating film 21 and the free layer 12 and the tunnel barrier layer 13 comprising the MTJ lamination film so as to expose the fixed layer 11 by etching, for example. This opening 23 is used to form the write electrode 8 and is also used to cut a part of (in particular, the free layer 12) the MTJ lamination film at two places on the circumference. Accordingly, the opening 23 is shaped like approximately,, from a plan view standpoint, i.e. shape obtained when two grooves are added to a circle.

Figure 6C:
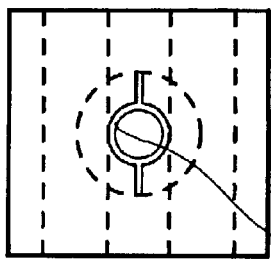
Figure 6C:
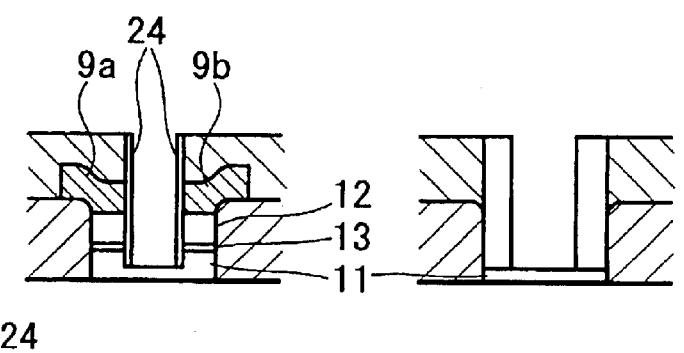
Figure 6D:
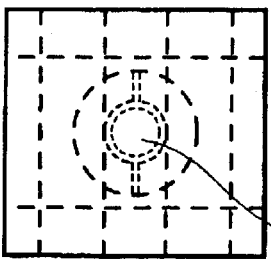
Figure 6D:
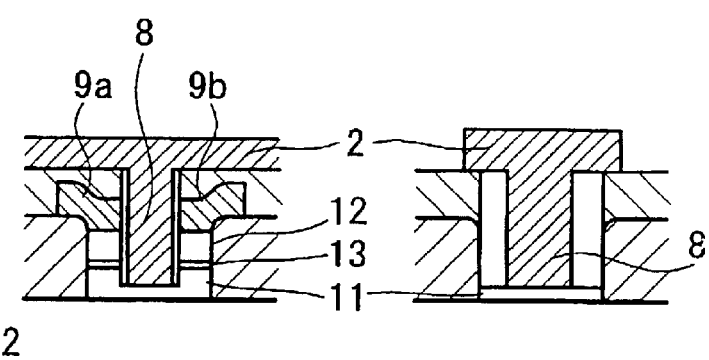

After the opening 23 had been formed, as shown in FIG. 6C, a suitable material such as $SiO_2$ is deposited and a side wall insulating film (side wall) 24 is formed by etch-back. The side wall insulating film 24 is formed so as to cover the inner wall of the circular hole that is used to form the write electrode 8 and the two grooves which are used to divide the free layer 12 and the like.

Then, as shown in FIG. 6F, the write electrode 8 made of a conductive material such as Cu (copper) is formed within the opening 23 covered with the side wall insulating film 24. At the same time, the write line that is interconnected to the write electrode 8 is formed so as to extend in a predetermined direction (e.g. left and right direction which is the direction perpendicular to the read lines 9a, 9b in the plan view) by a method similar to that of the read lines 9a, 9b. Through the above-mentioned manufacturing process, there is constructed the TMR element 1 having the above-mentioned arrangement (see FIG. 3 and FIGS. 4A to 4C).

Next, an example of the manner in which the TMR element 1 obtained by the above-mentioned manufacturing process can operate will be described below. In this example, operations for writing information on the TMR element 1 and operations for reading out information from the TMR element 1 will be described with reference to FIGS. 4A to 4C.

When information is written on the TMR element 1, a current flows through the write electrode 8 as earlier noted. Then, a current magnetic field is generated around the write electrode 8. Thus, the magnetization of either the clockwise direction or the counter-clockwise direction as shown by arrows in FIG. 4C when seen from above can be formed in the free layer 12 composed of the first and second regions 12a and 12b. Specifically, information can be written in the TMR element 1 by switching the magnetization in the free layer to either the clockwise direction or the counter-clockwise direction with application of the current magnetic field generated from the write electrode 8. Therefore, unnecessary magnetic field is not generated from the element in which information need not be written and hence it is possible to avoid the occurrence of write error.

At that time, although information of "0" or "1" is stored in the TMR element 1 by the magnetization direction of the free layer 12, the free layer 12 is divided into the two regions of the first and second regions 12a and 12b and the first and second regions 12a and 12b are shaped like approximately C-like regions in which the two regions 12a and 12b are opposed to each other. Therefore, at the portions in which the first and second regions 12a and 12b are cut, i.e. each end edge of the first and second regions 12a and 12b, a magnetic field leaked from the end edge is absorbed into the opposing end edge. Specifically, the first and second regions 12a and 12b located so as to surround the write electrode 8 constitute a magnetic field returning structure for returning a magnetic field generated by the free layer 12.

Thus, even when information of "0" or "1" is stored in the TMR element 1 by the magnetization direction in the free layer 12, since the magnetic field is returned by the magnetic field returning structure, a magnetic field leaked from the free layer 12 can be suppressed as much as possible, and the adjacent element can be prevented from being influenced by a leakage magnetic field.

Further, since a magnetic field is returned by the magnetic field returning structure, the magnetization state can obtain a constant state in the first and second regions 12a and 12b, in particular, near the end portions thereof. To be more concrete, since the first and second regions 12a and 12b are both shaped like approximately C-like regions, microscopic magnetic moments can take only so-called C states and hence, various states such as an eddy state, the C state and an S state can be prevented from being mixed. Therefore, a coercive force in the first and second regions 12a and 12b can be stabilized.

From these reasons, when information is recorded by the use of the magnetization direction, the free layer 12 including the magnetic field returning structure can realize satisfactory information recording and can suitably cope with microminiaturization and the increase of integration degree of the TMR element 1.

On the other hand, since the free layer 12 is divided into the two regions of the first and second regions 12a and 12b, the resistance values in the MTJ structures are measured by using the two read lines 9a, 9b respectively interconnected to the first and second regions 12a and 12b and information is read out from the TMR element 1 by comparing the two measured values. More specifically, since the portions along which the first and second regions 12a and 12b are cut are disposed along the magnetization fixed direction in the fixed layer 11, the magnetization directions (see solid-line arrows in FIG. 4C) in the first and second regions 12a and 12b have different relative angles of the magnetization direction (see broken-line arrows in FIG. 4C) in the fixed layer 11 inevitably. Therefore, when a current flows through the two independent MTJ structures formed by the first and second regions 12a and 12b, it is unavoidable that the resultant resistance values become different from each other. Accordingly, if the measured values of the two resistance values are compared with each other and it is determined which of the two resistance values is larger, it is possible to recognize whether the magnetization direction in the free layer composed of the first and second regions 12a and 12b is in the clockwise direction or the counter-clockwise direction. That is, when information is read out from the TMR element 1, information is read out from the TMR element 1 by determining based upon the difference between the TMR effects of the two regions 12a and 12b opposed across the write electrode 8 whether the magnetization direction in the free layer 12 is the clockwise direction or the counter-clockwise direction.

As described above, when information is read out from the TMR element 1 by utilizing the difference between the TMR elements in the first and second regions 12a and 12b, since the magnetization direction in the free layer 12 is judged based upon the difference between the measured results of the resistance values, a threshold value and the like that are used to judge the magnetization direction need not be set unlike a general TMR element in which information is read out from the TMR element based upon a measured value of a single resistance value. Accordingly, since it becomes possible to properly judge the magnetization direction without being influenced by dispersions of coercive force of each element and the like, excellent read out characteristics can be realized.

Further, since excellent read out characteristics can be realized by only dividing the free layer 12 into the two regions 12a and 12b, the manufacturing process can be suppressed from becoming complicated as much as possible.

Figure 7A:
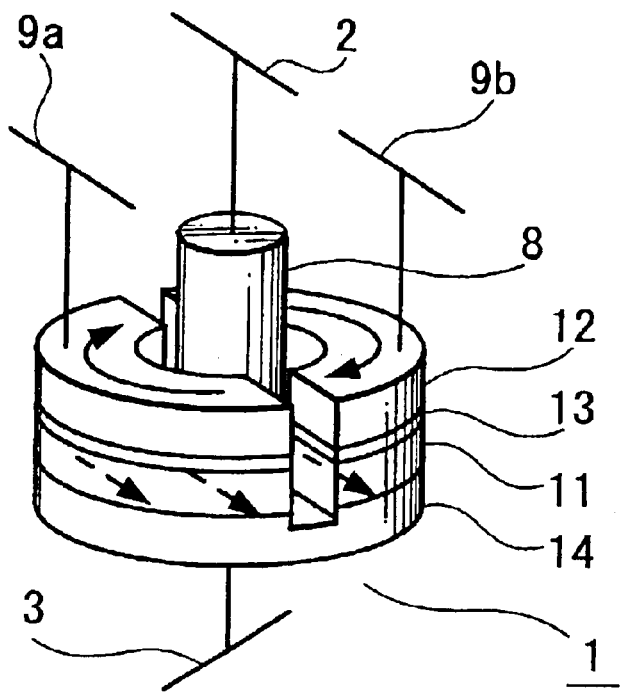
Figure 7B:
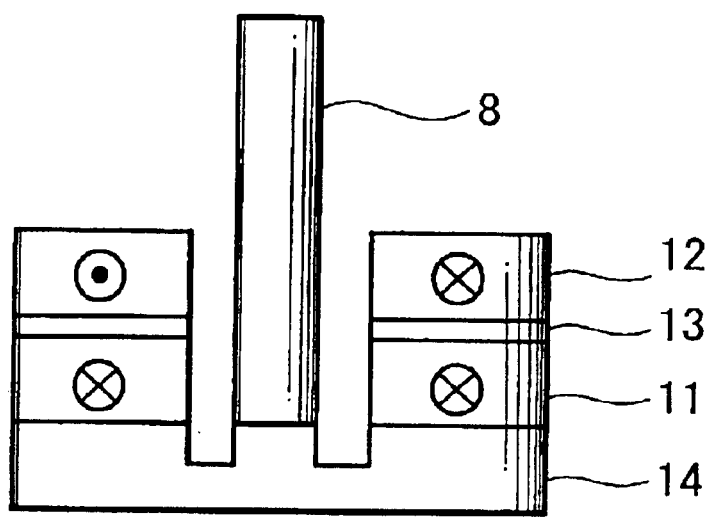

Next, a modified example of the TMR element 1 according to the present invention will be described. FIGS. 7A and 7B are schematic diagrams showing a second example of the arrangement of the TMR element 1. While the MTJ structure in which only the fixed layer 11, the tunnel barrier layer 13 and the free layer 12 are laminated in that order has been described so far as the film arrangement of the TMR element 1, the present invention is not limited thereto and an antiferromagnetic layer 14 may be added to the underside of the fixed layer 11 as shown in FIGS. 7A and 7B. The antiferromagnetic layer 14 may be formed by depositing a suitable material such as PtMn (platinum manganese) having a thickness of about 30 nm. When this antiferromagnetic layer 14 is added to the underside of the fixed layer 11, the magnetization in the fixed layer 11 can be fixed more stably and a stability of the function as the TMR element 1 can be increased.

The film arrangement of the TMR element 1 is not limited to the above-mentioned embodiment and the modified example. For example, the above-mentioned respective layers may be laminated in the opposite order and a protecting layer made of Ta (tantalum) may be added. Materials of the respective layers and film thickness of the respective layers may be similarly and properly determined in consideration of the size of the TMR element 1 and the like. The fixed layer 11 may not be limited to the size approximately the same as that of the free layer 12 and may have the size in which a plurality of free layers 12 can be arrayed, and the MTJ structure may be constructed by sharing the fixed layer 11 with these free layers 12.

While the first region 12a and the second region 12b comprising the free layer 12 are both formed like C-like shapes as set forth above, the first and second regions 12a and 12b are not limited to the above-mentioned shapes and may be shaped like other shapes so long as these shapes can form the magnetic field returning structure for returning a magnetic field. Other shapes may be such ones obtained when the first and second regions 12a and 12b are both formed like approximately U-like shapes (including symmetrical U-like shapes) and when C-like shape and U-like shape are combined (outer peripheral side is formed as C-like shape and inner peripheral side is formed as U-like shape or vice versa).

Figure 8A:
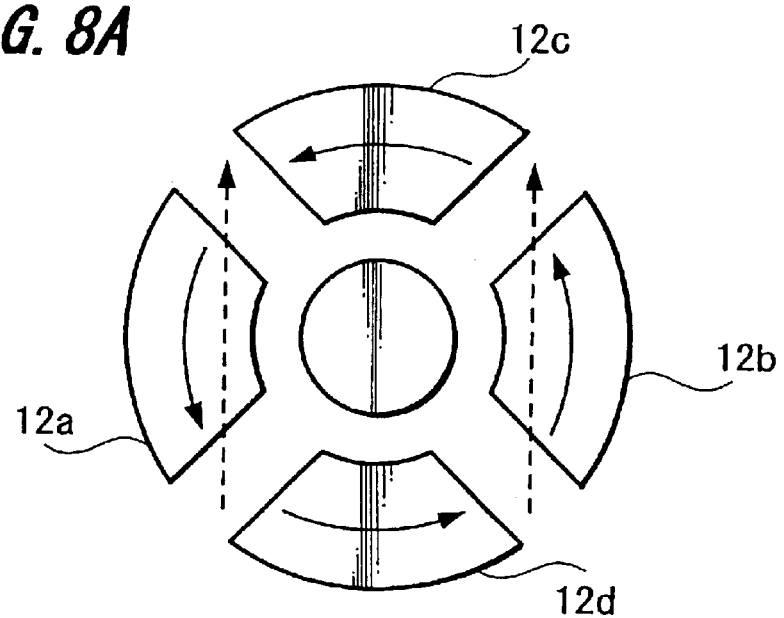
Figure 8B:
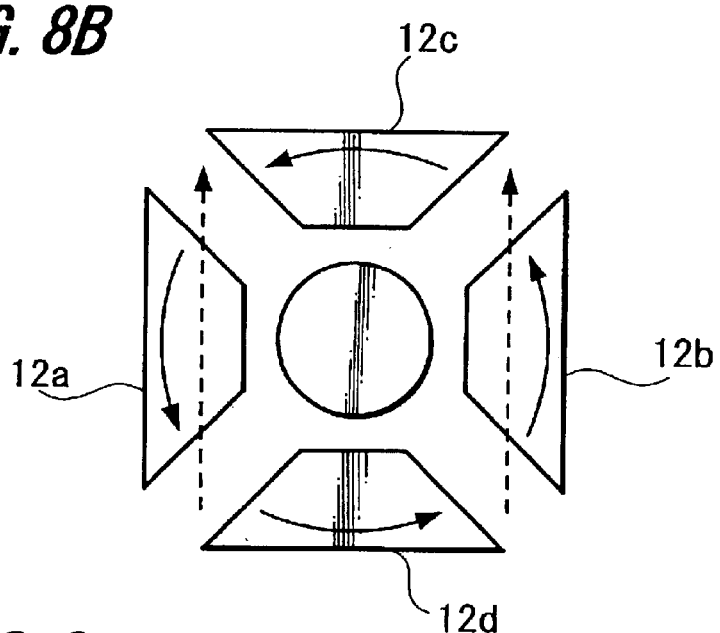

The number in which the free layer 12 is divided into the first and second regions 12a and 12b is not limited to two in the above-mentioned embodiment. FIGS. 8A and 8B are schematic diagrams showing a third example of the arrangement of the TMR element. The example shown in FIGS. 8A and 8B illustrates the case in which the free layer 12 is divided into four regions composed of the first region 12a, the second region 12b, a third region 12c and a fourth region 12d. Even when the free layer 12 is divided into the four regions 12a, 12b, 12c and 12d as described above, if the respective regions 12a to 12d are located so as to surround the write electrode 8 and the respective regions 12a to 12d constitute the magnetic field returning structure, then in exactly the same manner as the case in which the free layer is divided into the two regions 12a and 12b as described above, the occurrence of leakage magnetic field to the outside can be suppressed and satisfactory coercive force without dispersions can be obtained. In this case, as the shapes of the respective regions 12a to 12d which are used to form the magnetic field returning structure, there may be considered arc-like shapes shown in FIG. 8A and linear-like shapes or combinations thereof.

When the free layer 12 is divided into the four regions 12a to 12d, the read lines for reading information are interconnected to only the first and second regions 12a and 12b and resistance values of the MTJ structures are measured and those measured results are compared with each other, thereby making it possible to read out information from the free layer 12. Therefore, the third and fourth regions 12c and 12d may be made of the material different from that of the first and second regions 12a and 12b so long as they can form the magnetic field returning structure.

If information is read out from the TMR element based upon the measured results of the resistance values in the first and second regions 12a and 12b, there is then an advantage that the difference of relative angles with the magnetization fixed direction in the fixed layer 11 increases as compared with the case in which the free layer 12 is divided into the two regions 12a and 12b. Specifically, when information is read out from the TMR element 1, influences exerted by portions which are not parallel to the magnetization direction in the fixed layer 11 can be removed as much as possible. Therefore, the magnetization direction can be more properly judged without being damaged by influences such as dispersions of coercive force of each element and more satisfactory read out characteristics can be realized as compared with the case in which the free layer is divided into the two regions.

As the number in which the free layer is divided, the above-mentioned two or four regions should be desired and the number of the divided regions may not of course be limited to these two or four. It is needless to say that a magnetic field returning structure may be constructed by dividing the free layer into a plurality of regions other than two or four regions.

Figure 9:
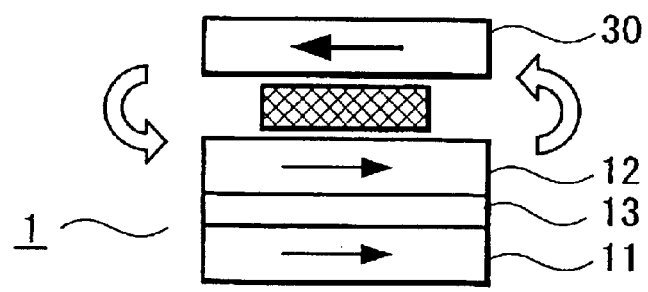
FIG. 9 is a diagram schematically showing a fourth example of an arrangement of a TMR element according to the present invention.

Further, the magnetic field returning structure can be realized by other arrangements than the arrangement in which the free layer is divided into regions from a plane standpoint. As shown in FIG. 9, for example, with respect to the TMR element 1 having the arrangement without the write electrode 8, a magnetic layer 30 may be laminated at the position in which it is opposed to the word lines and the bit lines disposed near the free layer 12 and thereby the magnetic field returning structure may be formed. Also in this case, since the magnetic field generated from the free layer 11 is returned by the magnetic field returning structure, a magnetic field can be prevented from being leaked to the outside of the TMR element 1 as much as possible and the magnetic moment within the free layer 11 can take a uniform state.

Furthermore, the magnetic field returning structure is not limited to the TMR element and can be exactly similarly applied to a GMR (giant magnetoresistive) type in which a nonmagnetic material layer between a storage layer and a fixed layer is made of Cu (copper) and the like. That is, the present invention can be applied to any magnetoresistive effect element so long as the magnetoresistive effect element can generate MR effect.

As set forth above, according to the present invention, since the magnetic field returning structure for returning a magnetic field generated by the free layer can be prevented from generating a leakage magnetic field, a bad influence can be prevented from being exerted upon the magnetoresistive effect element by the leakage magnetic field even when the magnetoresistive effect element is microminiaturized and increased in integration degree. Further, since a magnetic field is returned, the magnetic moment in the free layer of the magnetoresistive effect element can take a uniform state and thereby coercive force can be stabilized. Therefore, even when the magnetoresistive effect element is microminiaturized and increased in integration degree, changes and dispersions of coercive force can be suppressed as much as possible and hence satisfactory information recording characteristics can be realized.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. In a magnetoresistive effect element in which at least a free layer made of a ferromagnetic material, a nonmagnetic layer made of a nonmagnetic material and a fixed layer made of a ferromagnetic material and of which the magnetization direction is fixed are laminated in that order and in which information is recorded by the use of a change of the magnetization direction of said free layer, a magnetoresistive effect element comprising a magnetic field returning structure for returning a magnetic field generated by said free layer.

2. In a magnetoresistive effect element in which at least a free layer made of a ferromagnetic material, a nonmagnetic layer made of a nonmagnetic material and a fixed layer made of a ferromagnetic material and of which the magnetization direction is fixed are laminated in that order and in which information is recorded by the use of a change of a magnetization direction of said free layer, a magnetoresistive effect element characterized in that said free layer is divided into a plurality of regions;

said plurality of regions are located around a write electrode extending in the lamination direction of each layer so as to surround said write electrode; and said respective regions surrounding said write electrode constitute a magnetic field returning field.

3. A magnetoresistive effect element according to claim 2, wherein said free layer is divided into two regions of approximately C-shape or approximately U-shape or a shape of a combination of approximately said C-shape or approximately U-shape.

4. A magnetoresistive effect element according to claim 2, wherein said free layer is divided into four regions of arc-like shape or linear shape or shape of a combination of said arc-like shape or said linear shape.

5. A magnetoresistive effect element according to claim 2, wherein information is read out by the use of a difference between magnetoresistive effects of two regions opposing across said write electrode.

6. In a magnetic memory device including a magnetoresistive effect element in which at least a free layer made of a ferromagnetic material, a nonmagnetic layer made of a nonmagnetic material and a fixed layer made of a ferromagnetic material and of which the magnetization direction is fixed are laminated in that order and in which information is recorded by the use of a change of the magnetization direction of said free layer, said magnetic memory device comprising a magnetic field returning structure for returning a magnetic field generated by said free layer.

7. In a magnetic memory device including a magnetoresistive effect element in which at least a free layer made of a ferromagnetic material, a nonmagnetic layer made of a nonmagnetic material and a fixed layer made of a ferromagnetic material and of which the magnetization direction is fixed are laminated in that order and in which information is recorded by the use of a change of a magnetization direction of said free layer, said magnetic memory device characterized in that said free layer is divided into a plurality of regions;

said plurality of regions are located around a write electrode extending in the lamination direction of each layer so as to surround said write electrode; and said respective regions surrounding said write electrode constitute a magnetic field returning field.

8. A magnetic memory device according to claim 7, wherein said free layer is divided into two regions of approximately C-shape or approximately U-shape or a shape of a combination of approximately said C-shape or approximately said U-shape.

9. A magnetic memory device according to claim 7, wherein said free layer is divided into four regions of arc-like shape or linear shape or a shape of combination of said arc-like shape or said linear shape.

10. A magnetic memory device according to claim 7, wherein information is read out by the use of a difference between magnetoresistive effects of two regions opposing to each other across said write electrode.

* * * * *